(12) United States Patent
Green et al.

(10) Patent No.: US 6,533,868 B1
(45) Date of Patent: Mar. 18, 2003

(54) DEPOSITION APPARATUS

(75) Inventors: Gordon Robert Green, Bristol (GB); Robert William Teagle, Bridgewater (GB); Anthony William Barrass, Bristol (GB)

(73) Assignee: Trikon Holdings Limited, Newport (GB)

( * ) Notice: Subject to any disclaimer, the term of this patent is extended or adjusted under 35 U.S.C. 154(b) by 0 days.

(21) Appl. No.: 09/568,987

(22) Filed: May 11, 2000

(30) Foreign Application Priority Data

May 11, 1999 (GB) .............................................. 9910724

(51) Int. Cl.[7] .......................... C23C 14/00; C23C 16/00
(52) U.S. Cl. ...................... 118/720; 118/715; 118/728; 118/729; 204/298.11
(58) Field of Search ................................ 118/715, 720, 118/728, 729; 204/298.11

(56) References Cited

U.S. PATENT DOCUMENTS

| 4,828,668 | A | | 5/1989 | Yamazaki et al. |
|---|---|---|---|---|
| 5,259,881 | A | | 11/1993 | Edwards et al. |
| 5,447,570 | A | * | 9/1995 | Schmitz ....................... 118/728 |
| 5,569,350 | A | * | 10/1996 | Osada .......................... 118/729 |
| 5,574,247 | A | * | 11/1996 | Nishitani ..................... 118/708 |
| 5,660,114 | A | | 8/1997 | Gruber |
| 5,997,651 | A | * | 12/1999 | Matsuse ....................... 118/728 |
| 6,051,122 | A | * | 4/2000 | Flanigan ................. 204/298.11 |
| 6,192,827 | B1 | * | 2/2001 | Welch ..................... 118/723 E |
| 6,296,712 | B1 | * | 10/2001 | Guo ............................. 118/728 |

FOREIGN PATENT DOCUMENTS

| JP | 9-157839 | 6/1997 |
|---|---|---|
| WO | WO 86/06753 | 11/1986 |
| WO | WO 96/35823 | 11/1996 |

* cited by examiner

*Primary Examiner*—Richard Bueker
(74) *Attorney, Agent, or Firm*—Volentine Francos, PLLC

(57) ABSTRACT

This invention relates to an apparatus for depositing a layer of material on to a workpiece. The apparatus includes chamber 11, a sputter target 12, a wafer support 13, wafer transport aperture 14 and a wafer transport mechanism 15. The last delivers the wafers along a transport path 16. An annular shield 19 is disposed between the support 13 and the target 12 and lies in the wafer transport path 16. Pins 30 are provided to lift the annular shield out of the transport path 16.

8 Claims, 3 Drawing Sheets

DEPOSITION APPARATUS

This invention relates to a apparatus for depositing a layer of material on to a workpiece.

In many manufacturing processes, including the manufacture of semi-conductor devices, sensors and MEMS, there is a need to deposit layers or thin films of materials onto workpieces. In physical vapour deposition there is a source of material within a chamber whereby material is ejected from the source onto the workpiece to form a layer. The source of material may be a sputter target or it may be an evaporated source or some other source of material that forms at least part of a deposited layer. In any of these cases the material tends to be deposited not only on the workpiece but also on other parts of the chamber in which the process has taken place. Traditionally, the solution has been to cover all long term exposed surfaces with removable shields. Workpieces are usually located on a support and providing shielding around and below the support can be particularly awkward, because such shields can be expensive to form and difficult to locate, given that it is desirable that no threaded fasteners should be used within a chamber, because of the danger of creating damaging particles.

Particular problems arise in connection with the support and the workpiece. Two manufacturing situations tend to exist. The first is where the workpiece is smaller than the support and lies within its periphery. In that case extra deposited material can affix the workpiece to the support or can build up on the surface of the support causing incorrect seating of subsequent workpieces. The second situation is where the workpiece overhands the support. In this arrangement it effectively shields the support, but unwanted deposition can occur on both the edge and the back side of the workpiece. (In some situations manufacturers do require deposition on the edge).

The best solution proposed to date to this problem has been to provide a fixed shield which overlies the periphery of the workpiece and the support, but this has a number of disadvantages. First it tends to preclude deposition on the edge of the wafer, when that is desirable, and secondly it makes the loading of workpieces on to the support extremely complex. Essentially the whole support has to be moved away from the shield so as to give sufficient room for the wafer to be lifted from the support and then removed by a transport mechanism. As very frequently the support will have electrical, cooling and mechanical connections, the need to move the support introduces significant expense and complication.

From one aspect the invention consists in apparatus for depositing a layer of material onto a workpiece including a chamber, a source of material, a workpiece support for supporting a workpiece with an exposed surface facing the material source onto which a layer is deposited, means for loading and unloading the workpiece along a transport path and a shield disposed between the support and the material source for limiting the amount of material deposited on or adjacent to the periphery of the support or workpiece characterised in that the shield lies in the transport path and in that the apparatus further comprises a mechanism for moving the shield out of the transport path during loading and unloading.

The apparatus may further comprise a further shield surrounding the support for shielding the back of the periphery of the workpiece and, in some embodiments, the further shield may shield the edge of the workpiece.

It is preferred that, when in its shield position, the first-mentioned shield forms a labyrinth path with the support, the further shield and/or the workpiece. To enhance this labyrinth path the further shield may have a radial extension.

The apparatus may further comprise means for lifting and lowering the workpiece into or from the transport path and these lifting and lowering means may incorporate or be linked to the mechanism for moving the shield so that as the workpiece is lifted off the support, the shield moves out of the transport path. The lifting/lowering means may include a liftable frame carrying a first set of pins for engaging the workpiece and a second set of pins for engaging the shielding. The second set of pins may serve as the support for the first mentioned shield, when it is in its shielding position as well as during movement of the shield.

The further shield may fall away as it extends radially outwardly to allow greater deposition to take place on its surface before the deposition upon it builds up to a level to contact the workpiece backside, or interfere with workpiece transportation.

The chamber may have or define a ledge formation and in that case the first mentioned shield may have a corresponding and cooperating formation whereby, when the first mentioned shield is in its shielding position, the formations form a labyrinth.

The first-mentioned shield will have a shape which is generally dictated by the shape of the periphery of the workpiece e.g. for a generally circular semi-conductor wafer, the first-mentioned shield will be generally annular.

From a further aspect the invention consists in apparatus for depositing a layer including a source of material, a workpiece support, a first shield for shielding the back periphery of a workpiece on the support and a second shield, interposed between the source and the first shield to shield the first shield.

Although the invention has been defined above it is to be understood that it includes any inventive combination of the features set out above or in the following description.

The invention may be performed in various ways and specific embodiments will now be described, by way of example, with reference to the accompanying drawings in which.

Figure 1:
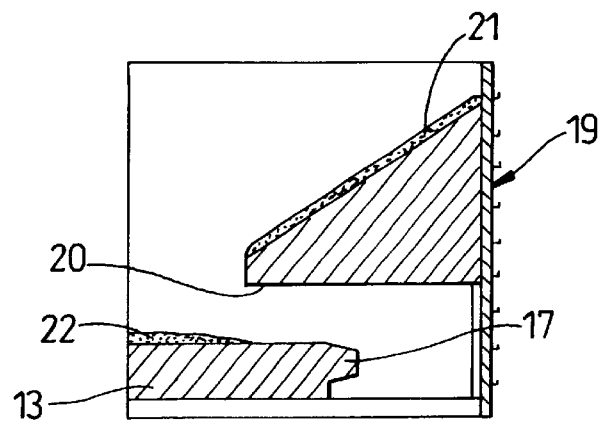
FIG. 1 illustrates a computer simulation of an edge shield, a workpiece and a workpiece support after a single deposition cycle.
Figure 2:
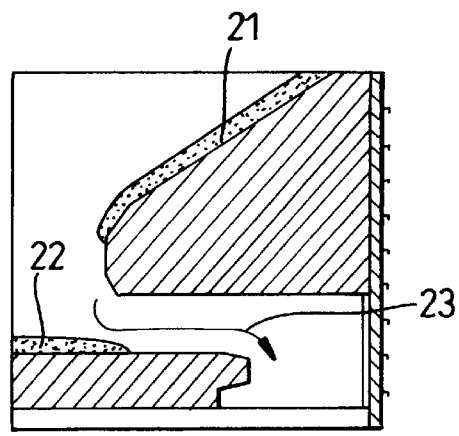
FIG. 2 is a corresponding simulation after a sputter target has been consumed.
Figure 3:
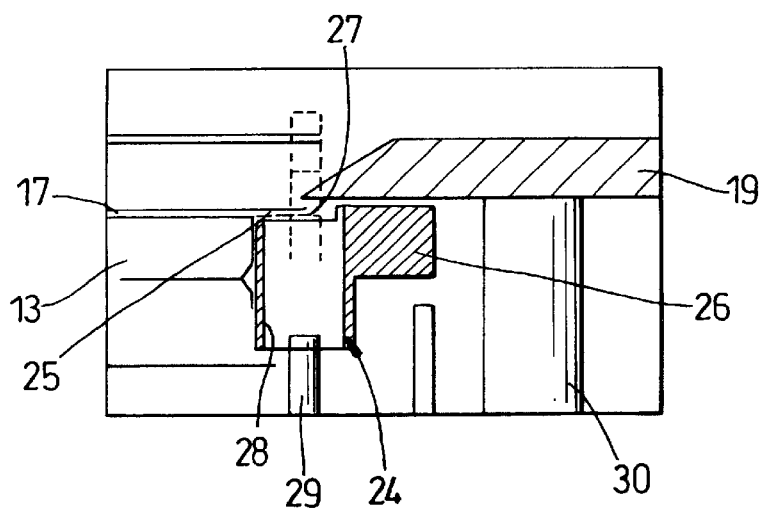
FIG. 3 is a detailed cross-section taken at the area of the edge of a support and the corresponding shielding of one embodiment of the invention.
Figure 4:
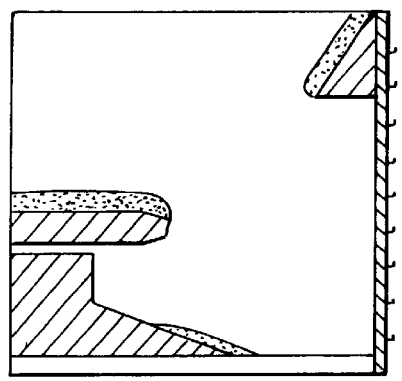
Figure 5:
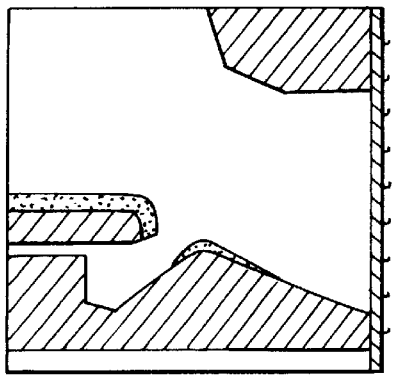
Figure 6:
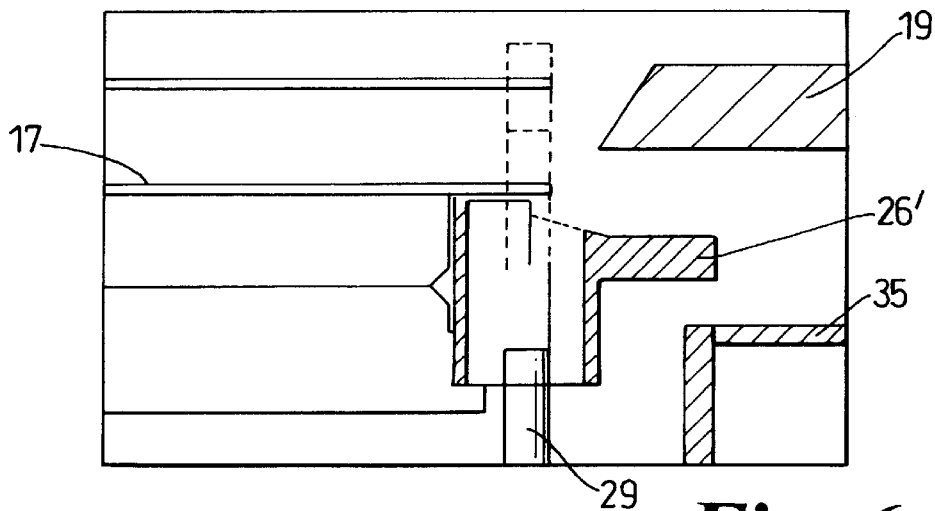
Figure 7:
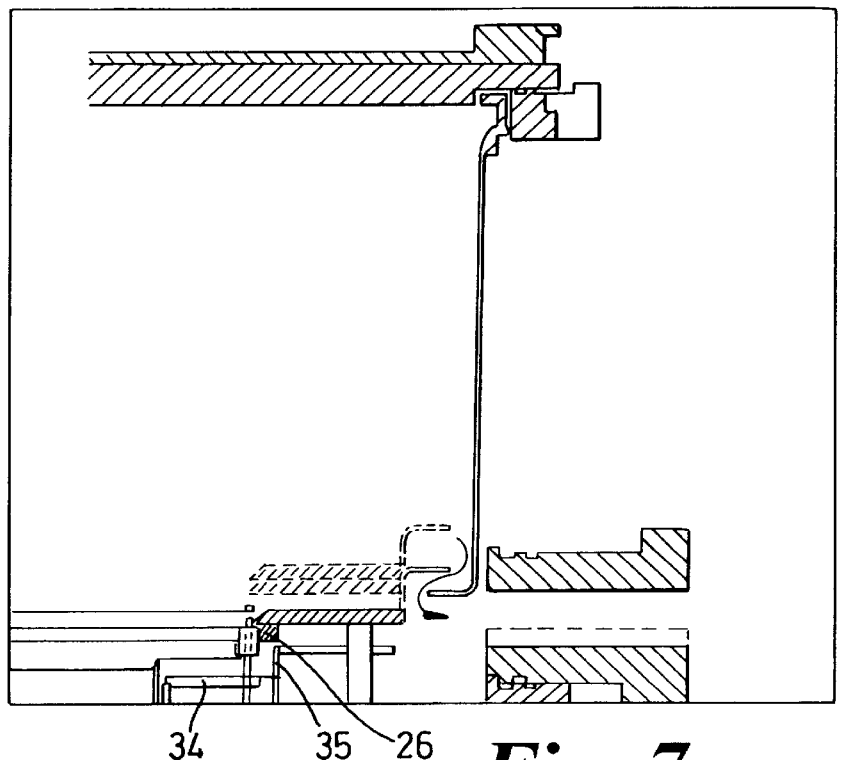
Figure 8:
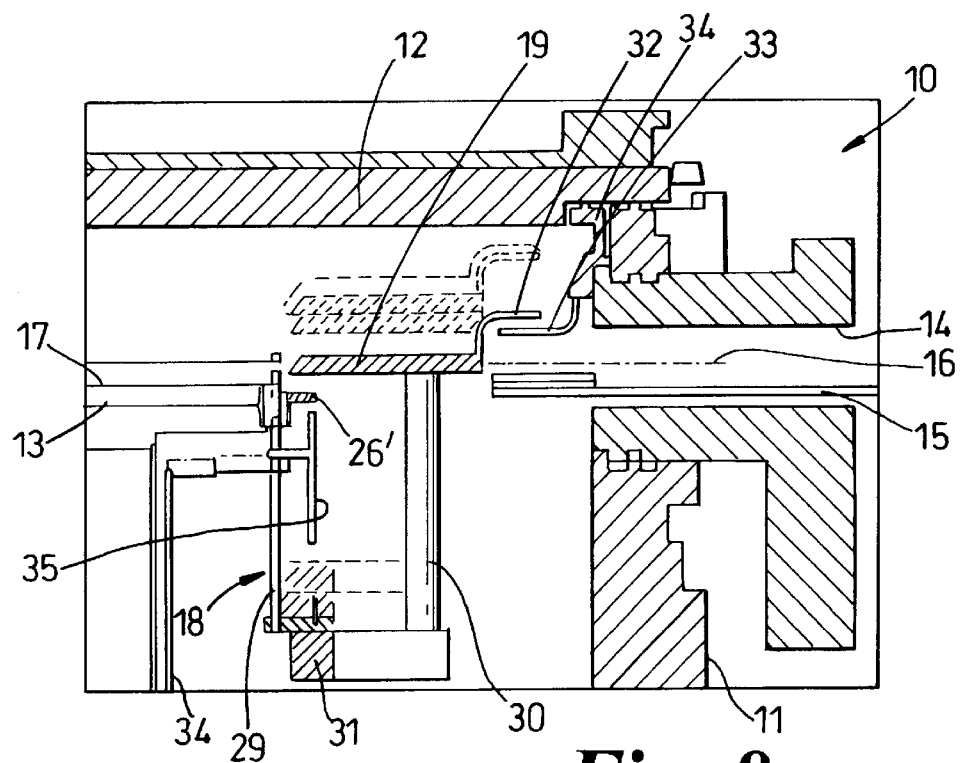

FIGS. 4 and 5 correspond to FIGS. 1 and 2 for a different embodiment of the invention and FIG. 6 corresponds to FIG. 3 for that different embodiment;

FIG. 7 is a cross-sectional view of a more substantial part of the chamber in which the embodiment of FIG. 3 is utilised; and FIG. 8 is a corresponding view to FIG. 7 for the embodiment of FIG. 6.

Referring first to FIGS. 7 and 8 a deposition apparatus is generally indicated at 10 and includes a chamber, generally indicated at 11, a sputter target 12, a wafer support 13, wafer transport aperture 14 and a wafer transport mechanism 15, which is shown schematically. The wafer transport mechanism 15 delivers the wafers along a transport path, which is indicated at 16.

As will be described in more detail below semiconductor wafers 17 can be lifted from the support 13 by a lift mechanism generally indicated at 18. In this way they can be lifted into the transport path 16 and conversely lowered from that path onto the support 13.

An annular shield 19 is disposed between the support 13 and the target 12 and in fact lies in the wafer transport path 16 for reasons which will be set out below.

Turning now to FIGS. 1 to 3 the relationship between the annular shield 19, the wafer 17 and the wafer support 13 can be seen in more detail. Thus in FIGS. 1 and 2 it can be seen that the leading edge 20 of the annular shield 19 overhangs the wafer 17, which in turn overhangs the support 13. As can be seen the layer of deposited material 21 builds up on the annular shield 19 as the cycles take place and this increases the shielded area, without too significantly affecting the deposition 22 on the wafer.

To an extent this simulation in FIGS. 1 and 2 is equally applicable to the present embodiment and the previously described prior art arrangement. However, as has been mentioned, the position of the annular shield 19 can present loading and unloading problems and also, although a labyrinth path 23 is created between the wafer 17 and the annular shield 19, this is not necessarily sufficient to protect against back deposition on the wafer.

As can be seen in FIG. 3 the applicants overcome the second of these problems by providing a further annular shield 24 around the periphery of the support 13 so that it underlies the overhanging portion 25 of the wafer 17 and thus prevents deposition on that portion. The further shield has a radial extension 26 which upstands to protect the edge 27 of the wafer 17 and the extension 26 also extends along the under surface of the shield 19 to increase the efficacy of the labyrinth path 23.

As can be seen in FIG. 3, apertures 28 are formed in the back shield 24 to allow lifting pins 29 to pass therethrough and lift the wafer 17 from the support 13. The annular shield 19 is supported on another set of pins 30 and, as can be seen in FIG. 8 both sets of pins are carried by a ring 31. The ring can be lifted so that as the first set of pins 29 lift the wafer 17 and the second set of pins 36 lift the annular shield 19 out of the transport path 16 allowing the wafer transport mechanism 15 to remove the lifted wafer 17 and replace it with the next one. Once the following wafer is loaded on the first set of pins 29, the ring 31 is lowered so that the wafer 17 is placed on the support 13 and the annular shield 19 returns to its operative position.

It will be seen that the annular shield 19 carries an L-cross section element 32 at its outer edge which is arranged to cooperate with a ledge 33 on the inner chamber shielding 34. These two ledges 32, 33 prevent most material passing down below the annular shield 19, but provide a serpentine pump down path as illustrated by the arrow in FIG. 7.

Turning to FIGS. 4 to 6 and 8, a corresponding arrangement is illustrated for the situation where it is desired to be able to deposit material on the edge of the wafer 17. In this case annular shield 19 does not extend to cover that edge, but rather acts as a shield to limit material being deposited upon the radial extension 26' which falls away from the exposed edge, whilst still maintaining the labyrinth.

This inclined construction of the extension 26' means that it takes a significant period for the material, which does get deposited thereon, to build up to a level at which it would interfere with the seating of the wafer 17 or the transport thereof. Otherwise, this arrangement operates in a similar manner as the arrangement illustrated in FIGS. 1 to 3 and 7.

Extra shielding is provided at 34 and 35.

The arrangements discussed above provide a very elegant solution to the problem described. Indeed it has been found that the shielding is such that repeatable and consistent deposition on wafers can be achieved for the whole life of a target without any need to replace the shielding and without unwanted back deposition or edge deposition, where that is shielded against. The arrangement avoids the need for movement of the support between each wafer, although a progressive movement of the support towards the target could take place to compensate for the fact that the target is being consumed. The arrangement is particularly convenient in that case, because it allows for corresponding adjustment of the position of the shields, simply by altering the rest position of the ring. The transport path location can equally be adjusted.

In certain processing arrangements pre-set positions for the support and annular shield 19 may be selected to suite particular processing phases. The above arrangement is still beneficial both because it can provide shielding of the backshielding, in the FIGS. 4 to 6 and 8 arrangement in particular, and because it enables the annular shield position in the transfer plane to be one of the options.

What is claimed is:

1. Apparatus for depositing a layer of material onto a workpiece, said apparatus comprising:
   a chamber,
   a source of material,
   a workpiece support for supporting a workpiece with an exposed surface facing the material source onto which a layer is deposited,
   means for loading and unloading the workpiece along a transport path, and
   a first shield which is movable between a process position and a load/unload position, wherein when the first shield is disposed in the process position the shield lies in the transport path and is entirely spaced from and between the workpiece and the material source for limiting the amount of material deposited on or adjacent to a periphery of the workpiece support or workpiece, and wherein when the first shield is disposed in the load/unload position the shield lies out of the transport path;
   a mechanism for moving the first shield, independently of the workpiece support, to the process position during deposition of a layer on the workpiece, and for moving the first shield to the load/unload position during loading and unloading of the workpiece along the transport path; and
   a second shield surrounding the support for shielding a back of the periphery of the workpiece, wherein the mechanism moves the first shield independently of the second shield;
   wherein the mechanism includes a liftable frame carrying a first set of pins which extend through the second shield to engage the workpiece and a second set of pins which engage the first shield.

2. Apparatus as claimed in claim 1, wherein the second shield shields an edge of the workpiece.

3. Apparatus as claimed in claim 1, wherein the first shield forms a labyrinth path with the workpiece support and/or the workpiece.

4. Apparatus as claimed in claim 1, wherein the second shield has a radial extension which protrudes away from the workpiece support and under the first shield.

5. Apparatus as claimed in claim 1, further comprising means for lifting and lowering the workpiece into or from the transport path.

6. Apparatus as claimed in claim 5, wherein the means for lifting and lowering the workpiece incorporates or is linked to the mechanism for moving the first shield.

7. Apparatus as claimed in claim 1, wherein an upper surface of the second shield extends downwardly in a radial direction to allow deposition to take place on an edge of the workpiece.

8. Apparatus as claimed in claim 1, wherein the chamber has or defines a ledge formation and wherein the first shield has a corresponding and cooperating formation whereby, when the first shield is in the first position the formations form a labyrinth.

* * * * *